United States Patent [19]

Okada et al.

[11] Patent Number: 5,150,274

[45] Date of Patent: Sep. 22, 1992

[54] MULTI-CHIP-MODULE

[75] Inventors: Kenichi Okada, Yokohama; Kyoko Amemiya, Kouhoku; Takao Terabayashi, Yokohama; Hideaki Sasaki, Hadano; Kuninori Imai, Tsukui; Shinichi Kazui, Hadano, all of Japan

[73] Assignee: Hitachi, Ltd., Tokyo, Japan

[21] Appl. No.: 727,042

[22] Filed: Jul. 9, 1991

[30] Foreign Application Priority Data

Jul. 11, 1990 [JP] Japan .................. 2-181451

[51] Int. Cl.⁵ .............................................. H05K 7/20
[52] U.S. Cl. ................................... 361/382; 165/80.4;
 165/185; 357/82; 361/385; 361/386; 361/388
[58] Field of Search ................. 165/80.4, 185; 357/82;
 361/382–386, 388, 389

[56] References Cited

U.S. PATENT DOCUMENTS 4,233,645 11/1980 Balderer et al. ..................... 361/385
4,558,395 12/1985 Yamada et al. ..................... 361/385

FOREIGN PATENT DOCUMENTS 0320198 6/1989 European Pat. Off. ............ 357/82
63-81959 4/1988 Japan ..................... 357/82
0208254 8/1988 Japan ..................... 357/82
64-36057 2/1989 Japan ..................... 357/82

OTHER PUBLICATIONS

IBM Technical Disclosure Bulletin, "Cooling System for Semiconductor Chips", vol. 23, No. 4 Sep. 1980, p. 1483.

Primary Examiner—Gregory D. Thompson
Attorney, Agent, or Firm—Antonelli, Terry, Stout & Kraus

[57] ABSTRACT

A multi-channel module with a plurality of chips is mounted on a multilayer circuit board and has a simple and highly reliable structure cooling system for cooling the heat generated by the chips consuming a large amount of electric power. The cooling system uses in the horizontal direction a coolant supply pipe having straight tube sections and flexible bellows sections alternately disposed in the axial direction of the pipe. The straight tube sections of the aforesaid coolant supply pipe are brought into contact with the upper faces of the chips by a spring force so as to cool continuously the plurality of chips with the coolant flowing in one coolant supply pipe thereby providing a simply structured cooling system for chips. Such a structured cooling system enables the collective assembly of cooling parts for a plurality of chips with only a small number of parts and produces highly reliable effects thereby being able to implement the miniaturization of a main frame computer.

8 Claims, 11 Drawing Sheets

MULTI-CHIP-MODULE

BACKGROUND OF THE INVENTION

The present invention relates to a multi-chip-module with a plurality of chips mounted on a multilayer circuit board. The present invention relates particularly to a multi-chip-module provided with a simply structured highly reliable cooling system for cooling the heat generated by the chips consuming a large electric power.

As shown in FIG. 26 and FIG. 27 (disclosed in Japanese Patent Laid-Open No. 226946/1986), the conventional multi-chip-module is of such a structure that a set of two bellows 60 for absorbing the thermal deformation of the chip 1 which is caused during its operation, the assembling error, and the like, and a cooling system comprising a cap 61 and fins 62 are provided for each of the chips 1, and that coolant 11 flows in from one of the bellows and flows out from the other to remove the heat generated by the chip 1 through the fins 62. However, the above-mentioned conventional technique is extremely complicated in terms of the structure, and requires a large number of fine cooling components. As a result, many assembling steps are needed for its fabrication. At the same time, there is a problem that it is difficult to assemble many chips in a batch. Also, there are many joints provided between the bellows and the cap, and the cap and the fins, leading to a possibility of coolant leakage due to corrosion affecting such joints. Hence there is a problem of lowering reliability of a main frame computer during long time use.

SUMMARY OF THE INVENTION

An object of the present invention is to provide a highly reliable multi-chip-module capable of miniaturizing the main frame computer, provided with the cooling system for chips which is simple in its structure in that it requires only a small number of parts thereby enabling a batch assembling of the cooling system for a plurality of chips.

In order to achieve the above-mentioned object, the multi-chip-module of the present invention is structured so as to use horizontally a coolant supply pipe having straight tube sections and flexible bellows sections alternately in the axial direction of the pipe for cooling a plurality of chips with the coolant flowing continuously through one coolant supply pipe by allowing the straight tube sections of the aforesaid coolant supply pipe to be in contact with the upper faces of the chips.

Also, in order to increase the cooling efficiency, the above-mentioned module is structured to enable the straight tube sections of the aforesaid coolant supply pipe to be in contact with the chips through thermal conductive grease under pressure exerted by springs.

Also, in order to increase the cooling efficiency, the above-mentioned module is structured so as to allow the straight tube sections of the aforesaid coolant supply pipe to be metallically joined to the chips by soldering, brazing, or the like.

Further, in order to increase the cooling efficiency, the above-mentioned module is structured so as to provide plate type cooling fins or foam metal blocks in the straight tube sections of the aforesaid coolant supply pipe.

Also, in order to improve the spacing arrangements for many numbers of the multi-chip-modules to be mounted on a circuit board, the above-mentioned module is structured to enable the coolant to flow in and out via the top face of the housing by bending both ends of the coolant supply pipe almost at right angles.

DESCRIPTION OF THE PREFERRED EMBODIMENTS

Hereinafter, the embodiments of the present invention will be described in accordance with FIG. 1 through FIG. 25.

Figure 7:
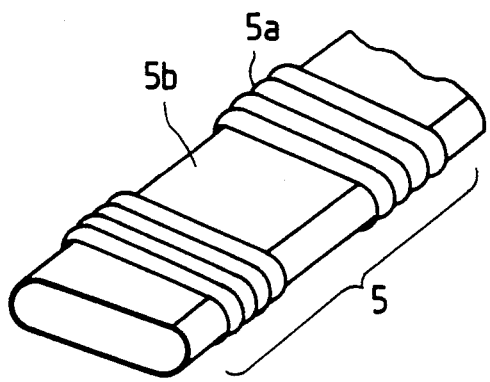
FIG. 7 is a perspective view showing a coolant supply pipe for the embodiment of the present invention in accordance with FIG. 1.
Figure 8:
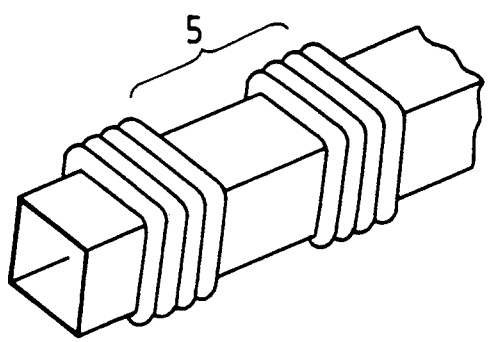
FIG. 8 is a perspective view showing an embodiment of the coolant supply pipe in accordance with FIG. 1.

At first, a first embodiment of the multi-chip-module provided with the cooling system for chips will be described in accordance with FIGS. 1-5, FIG. 7 and FIG. 8. The cooling system is of such a structure that the heat generated by chips 1 is exhausted to the outside of the module by the coolant 11 which flows into the coolant supply pipe 5 from the pipe arrangement 7 to perform heat exchange while flowing through the straight tube sections of the coolant supply pipe 5, which are in contact with the upper faces of the chips 1 and flows out to the pipe arrangement 8. As the coolant 11, water, a low-boiling-point dielectric liquid, or the like, can be used, for example. The coolant supply pipe 5 is formed with the straight tube sections having the elliptic or oval cross-section, and the flexible bellows sections alternately in the axial direction of the pipe as shown in FIG. 7. Also, as shown in FIG. 8, the cross-section of the straight tube section 5b of the coolant supply pipe 5 may be square or the like. Further, the length and width of the straight tube section 5b of the coolant supply pipe 5 should be larger than those of the chip 1. The bellows section 5a is a member which absorbs the camber of the circuit board 3, the irregular heights of chips 1 when assembled, and the displacement caused by the thermal distortion while in operation as well as functions as the flow passage for the coolant 11. Also, the straight tube section 5b is joined to the top face of the chip 1 by soldering, brazing, or the like to transfer the heat generated by the chip 1 to the coolant by the thermal conduction of this face. Here, an insulating layer 30 is provided on the upper face of the chip 1 to electrically insulate the chip and the coolant supply pipe 5 after these two are joined together. As the material of the coolant supply pipe 5, a material having resilience, and corrosion resistance to the coolant 11 such as phosphor bronze, titanium, and stainless steel can be used.

In this respect, the coolant supply pipe 5 can be produced by a plastic working such as a hydraulic formation.

In addition to the cooling system set forth above, there are a large number of chips 1 on the circuit board 3, which are electrically connected with each other through the terminals 2 thereof, and on the lower face of the circuit board 3, there are a large number of I/O leads 17 to connect the circuit board to a printed circuit board 24; thus configuring the multi-chip-module 50.

Figure 1:
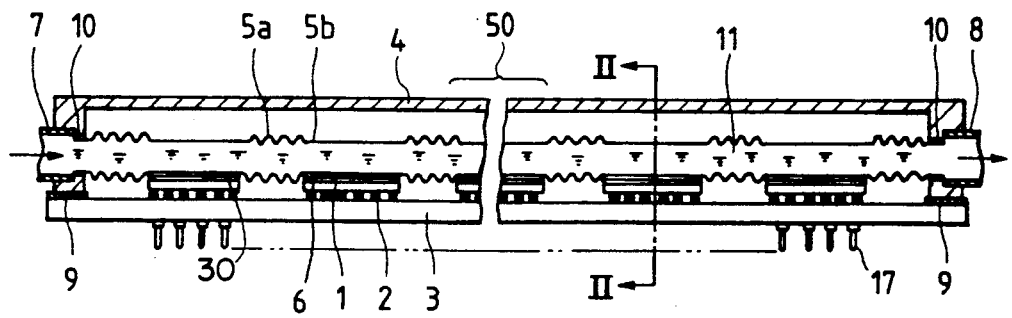
FIG. 1 is a cross-sectional view showing a first embodiment of the multi-chip-module according to the present invention.
Figure 2:
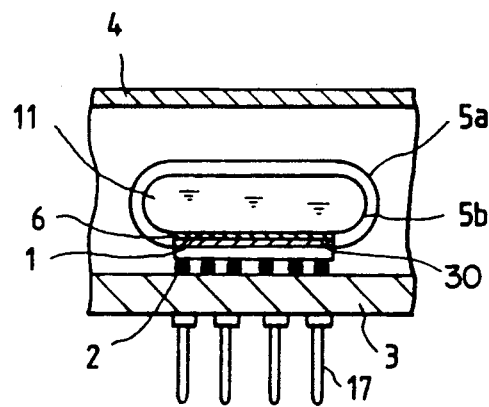
FIG. 2 is a longitudinally sectional view taken along the line II—II of FIG. 1.
Figure 3:
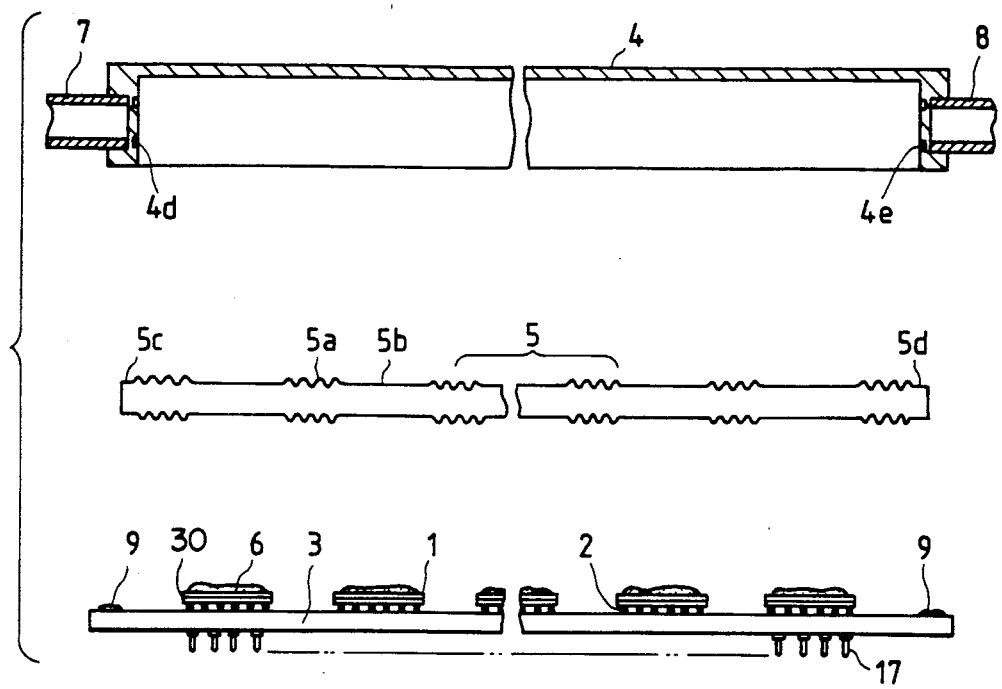
FIG. 3 is a view illustrating the assembling method for the first embodiment of the multi-chip-module according to the present invention.

Now, in conjunction with FIG. 3 and FIG. 4, the method of assembly will be described. Both ends 5c and 5d of the coolant supply pipe 5 are inserted into the catching holes 4d and 4e provided on the inner sides of the housing 4 to which pipe arrangements 7 and 8 have already been connected, and the joining 10 is performed by soldering, brazing, or the like. Here, the connecting position of the coolant supply pipe 5 is such that the joining face of the straight tube section 5b of the coolant supply pipe 5 is located at a position substantially the same as the height of the upper face of the chip 1 after the assembly. Subsequently, these are covered over the circuit board 3 where the chips 1 are fixed by the terminals 2. Here, a predetermined amount of paste form solder or brazing material is applied to each of the upper faces 6 of the chips 1 and sealing portions 9. Then, in the atmosphere of helium or nitrogen gas, or the like, the sealings 9 are performed by soldering, brazing, or the like, and at the same time, helium or nitrogen gas or the like are filled.

Figure 4:
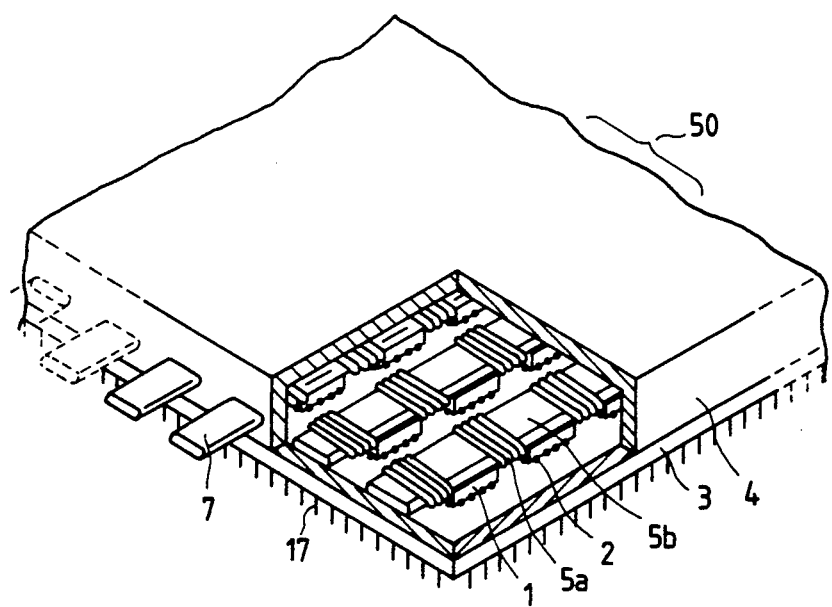
FIG. 4 is a perspective view showing the first embodiment of the multi-chip-module according to the present invention.

FIG. 4 is a view illustrating the assembled multi-chip-module 50 with a partially cut-away housing 4.

Figure 5:
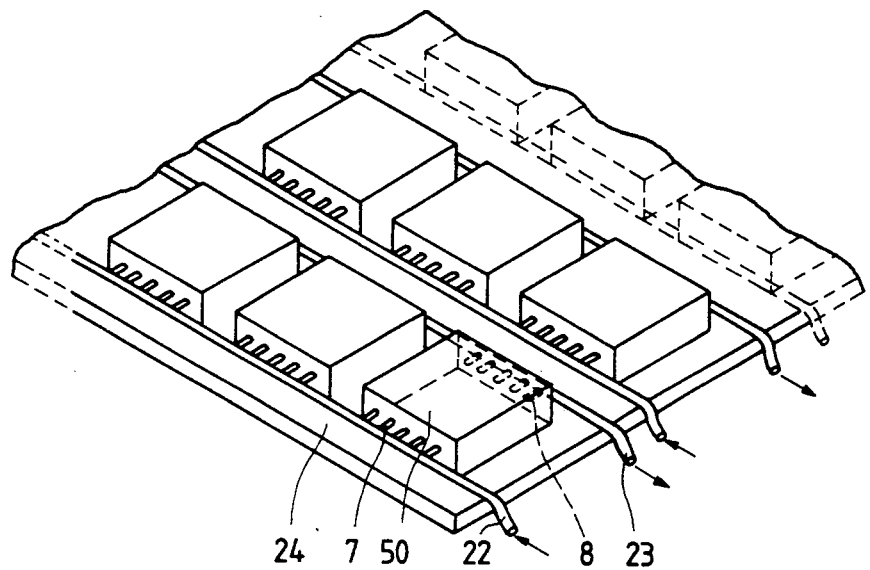
FIG. 5 is a perspective view showing a circuit board with the multi-chip-modules of the present invention being arranged thereon.

Now, FIG. 5 is a view showing an example in which these multi-chip-modules 50 are arranged on a printed circuit board 24. Here, the coolant 11 is guided into each of the pipe arrangements 7 from a main in-flow pipe 22 and is allowed to flow out from a main out-flow pipe 23 through each of the coolant supply pipes 5 and pipe arrangements 8; thus making it possible to cool a plurality of chips 1 continuously.

With the present embodiment, it is possible as the above describes to provide a multi-chip-module which is provided with the cooling system simple in its structure with a small number of parts and assembling steps without lowering the cooling efficiency. Now, taking a module with 100 pieces of chips as an example of comparison, the present embodiment is able to reduce the number of parts for the cooling system to approximately 1/10 or less those of the conventional module.

Figure 6:
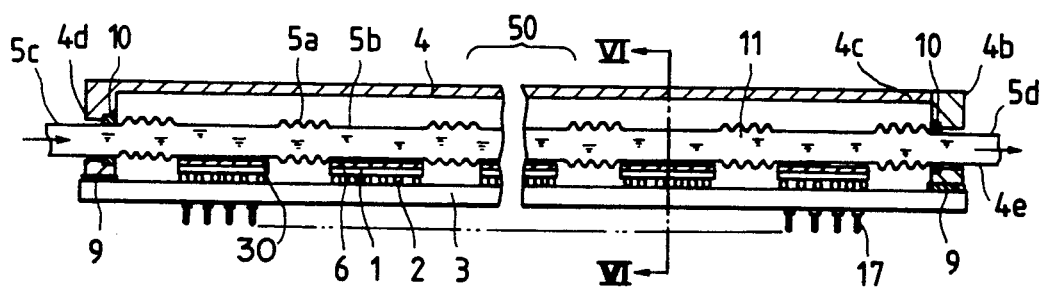
FIG. 6 is a cross-sectional view showing a second embodiment of the multi-chip-module according to the present invention.

Subsequently, in accordance with FIG. 6, a second embodiment of the present invention will be described. If a further reduction is desired in the number of parts of the first embodiment, it is possible to dispense with the pipe arrangements 7 and 8 by elongating the straight tube sections 5c and 5d at both ends of the coolant supply pipe 5 as shown in FIG. 6. However, if the housing 4 is integrally structured, it is impossible to insert the straight tube sections 5c and 5d at both ends of the coolant supply pipe 5 into the catch holes 4b and 4e. Therefore, the structure is arranged so that one side 4b of the housing 4 is separated and joined together at the portion 4c subsequent to the insertion of the straight tube sections. In this respect, all others are the same as the first embodiment.

As the above describes, although the joining process is needed for the fabrication of the housing 4, it is possible to dispense with the pipe arrangements 7 and 8. Hence a further reduction of the number of parts can be implemented.

Figure 9:
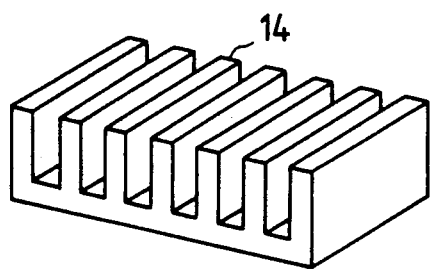
FIG. 9 is a perspective view showing in an embodiment of the fins in accordance with FIG. 1.
Figure 10:
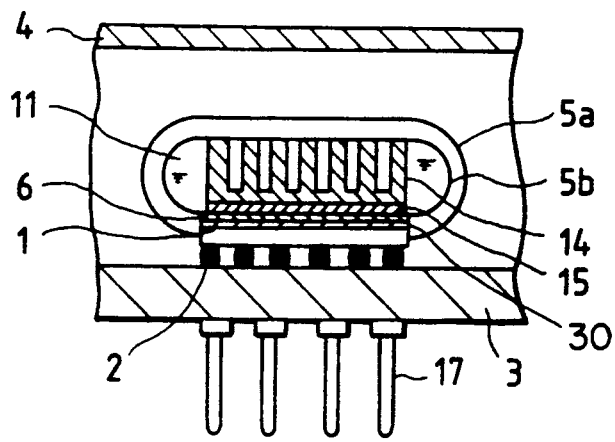
FIG. 10 is a longitudinally sectional view showing a third embodiment of the multi-chip-module according to the present invention.

Further, in accordance with FIG. 9 and FIG. 10, a third embodiment of the present invention will be described. When the heat generation of the chips 1 is great, the heat conduction to the coolant 11 should be enhanced. Therefore, the structure of the first embodiment of the multi-chip-module 50 is arranged so as to allow fins 14 to be joined to the straight tube section 5b of the coolant supply pipe 5 by soldering, brazing, or the like 15.

With this, the thermal conduction area is increased and the cooling efficiency is further enhanced. As the material of the fins 14, a material having an excellent thermal conductivity such as copper, aluminum, stainless steel or highly thermal conductive Sic ceramics can be used.

As the above describes, the present embodiment is particularly effective in such a case where the heat generation of the chips is great, necessitating the use of the multi-chip-module which is provided with a cooling system of excellent cooling efficiency.

Figure 11:
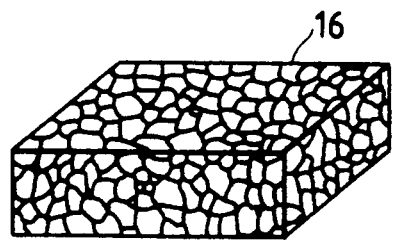
FIG. 11 is a perspective view showing a foam metal block in connection with FIG. 12.
Figure 12:
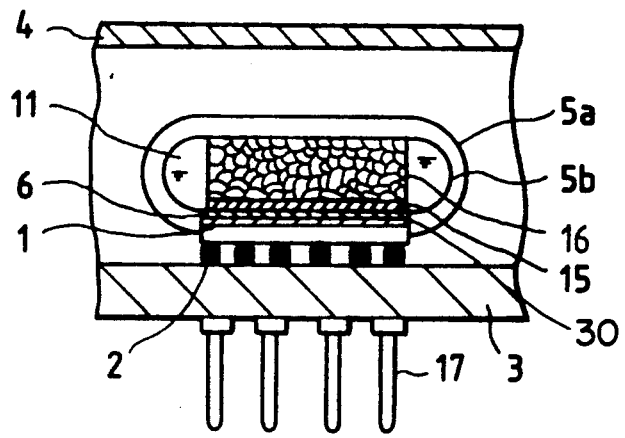
FIG. 12 is a longitudinally sectional view showing a fourth embodiment of the multi-chip-module according to the present invention.
Figure 13:
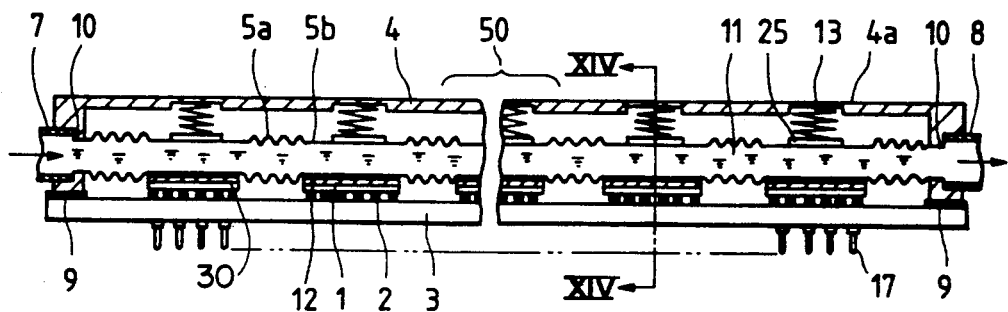
FIG. 13 is a cross-sectional view showing a fifth embodiment of the multi-chip-module according to the present invention.
Figure 14:
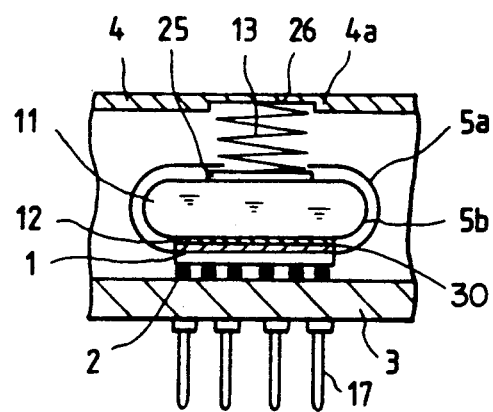
FIG. 14 is a longitudinally sectional view taken along the line XIV—XIV of FIG. 13.

Further, in accordance with FIG. 11 and FIG. 12, a forth embodiment of the present invention will be described. When the heat generation of the chips 1 is great, the thermal conduction to the coolant 11 should be enhanced. Therefore, a foam metal block 16 having a wide surface area is joined by soldering, brazing, or the like 15 to the straight tube section 5b of the coolant supply pipe 5 of the first embodiment of the multi-chip-module 50. With this, the thermal conduction area is significantly increased and the cooling efficiency is further enhanced. As the material of the foam metal block 16, a material having an excellent thermal conductivity such as copper, aluminum, or stainless steel can be used. Also, in place of the foam metal, a honeycomb type metal block or the like may be used.

As the above describes, the present embodiment is particularly effective in such a case where the heat generation of the chips is great, necessitating the use of the multi-chip-module which is provided with a cooling system of excellent cooling efficiency.

Further, in accordance with FIGS. 13-17, a fifth embodiment of the present invention will be described. If any camber of the circuit board 3 occurs at the time of fabrication or the joinings between the chips 1 and the terminals are not precise enough, the heights at the upper face level of the chips 1 become more irregular. If such takes place, there may be some cases where it is difficult to join the upper faces of the chips 1 and the straight tube sections 5b of the coolant supply pipe 5 because by the method of the present embodiment the gaps between them become too great. Therefore, by arranging the structure of the multi-chip-module so as to allow the straight tube sections 5b of the coolant supply pipe 5 to be pressed against the upper faces of the chips 1 by springs 13; thus absorbing the height irregularity at the time of assembly to make the cooling possible.

Further, by applying thermal conductive grease 12 between the straight tube sections 5b of the coolant supply pipe 5 and the upper faces of the chips 1, i.e., the thermal conduction portions, it is possible to increase the cooling efficiency for the chips 1. As the material of the thermal conductive grease 12, a mixture of silicon oil and thermal conductive fine powder or the like can be used. The spring 13 is provided for each of the chips 1, and is formed in such a manner that one end thereof is joined to the spring joint hole 4a of the housing 4 and the other end is joined to a disc 25. Here, the disc 25 is provided to allow the spring force to be applied evenly to the straight tube section 5b of the coolant supply pipe 5. Also, the load exerted by the springs 13 should be less than the value (an allowable load per terminal x the number of the terminals) in order to minimize any possible damage to the terminals 2.

Figure 15:
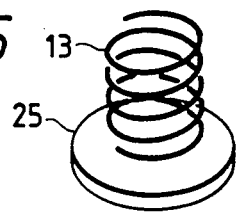
FIG. 15 is a perspective view showing the spring section of the fifth embodiment of the present invention.
Figure 16:
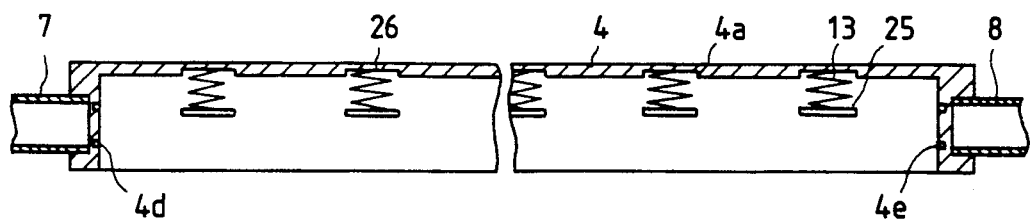
FIG. 16 is a cross-sectional view showing the housing of the fifth embodiment of the present invention.

Now, the assembling method will be described. As shown in FIG. 15, the disc 25 is joined to the one end of the spring 13 by soldering, brazing, or the like. Then, the joint portion 26 of the spring thus formed is joined by soldering, brazing, or the like to the spring joint hole 4a of the housing 4 to which the pipe arrangement 7 has already been connected as shown in FIG. 16.

Subsequently, both ends 5c and 5b of the coolant supply pipe 5 are inserted into the connection holes 4b and 4e provided inside the housing 4 and the joinings 10 are performed by soldering, brazing, or the like. Here, the connecting position of the coolant supply pipe 5 is such that the joining faces of the straight tube sections 5b of the coolant supply pipe 5 are placed substantially at the same height as the upper faces of the chips 1 after assembly. Then, these are set over the circuit board 3 with the chips 1 being fixedly mounted by the terminals 2 thereon. Here, if the thermal conductive grease 12 is applied to the upper faces of the chips 1 beforehand, the thermal conduction between the straight tube sections 5b of the coolant supply pipe 5 and the upper faces of the chips 1 is increased to enhance the cooling efficiency. Also, a predetermined amount of paste type solder or brazing material is applied to each of the sealing portions 9. Subsequently, in the atmosphere of helium or nitrogen gas or the like, the joinings 6 between the upper faces of the chips 1 and the straight tube sections 5b of the coolant supply pipe 5 and the sealings 9 are performed by soldering, brazing, or the like. At the same time that the multi-chip-module 50 is assembled, helium or nitrogen gas is filled.

Figure 17:
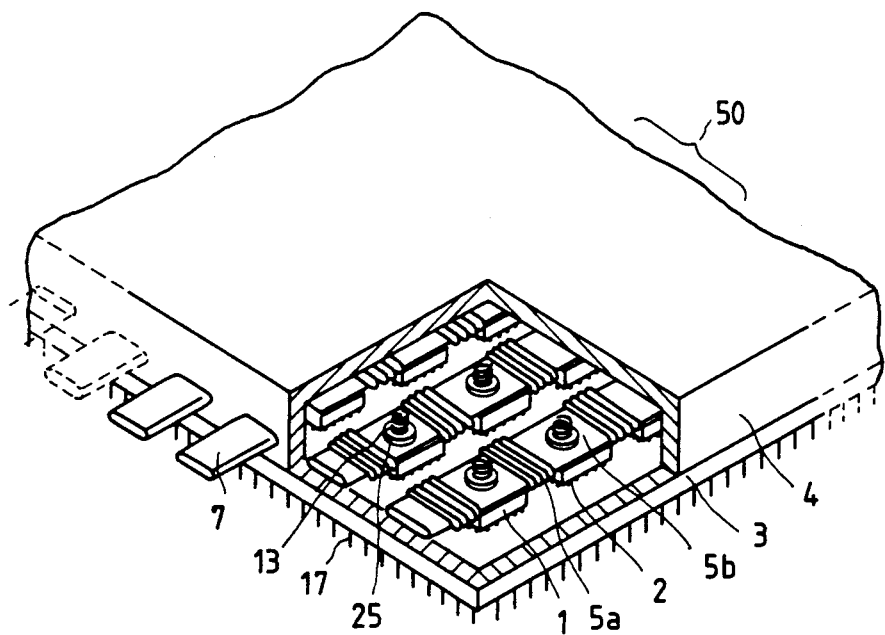
FIG. 17 is a perspective view showing the fifth embodiment according to the present invention.

FIG. 17 is a view showing the assembled multi-chip-module 50 of the present embodiment with partially cut-away housing 4.

As the above describes, with the present embodiment it is possible to provide a multi-chip-module which is provided with the cooling system particularly effective when the irregularity of the heights of the upper faces of the chips 1 is great.

Figure 18:
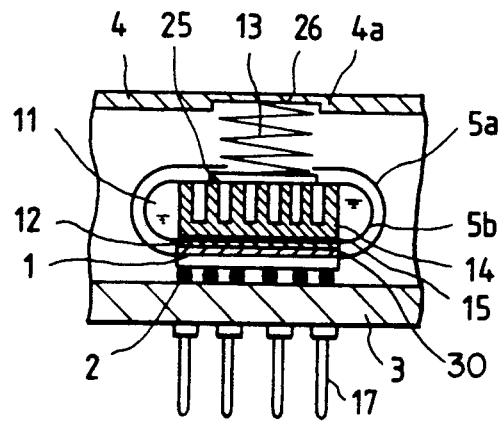
FIG. 18 is a longitudinally sectional view showing a sixth embodiment according to the present invention.

Further, in accordance with FIG. 18, a sixth embodiment of the present invention will be described. In the fifth embodiment, if the heat generation of the chips 1 is great, it is necessary to enhance the thermal conduction to the coolant 11. Therefore, in the cooling system for the fifth embodiment of the multi-chip-module 50, the structure is arranged to allow the fins 14 shown in FIG. 9 to be joined to the straight tube sections 5b of the coolant supply pipe 5 for each of the chips 1 by soldering, brazing, or the like 15. With this, the thermal conduction area is increased to enhance the cooling efficiency.

As a result, with the present embodiment, it is possible to provide a multi-chip-module which is provided with a cooling system capable of maintaining its cooling efficiency even when the irregularity of the heights of the upper faces of the chips 1 is great.

Figure 19:
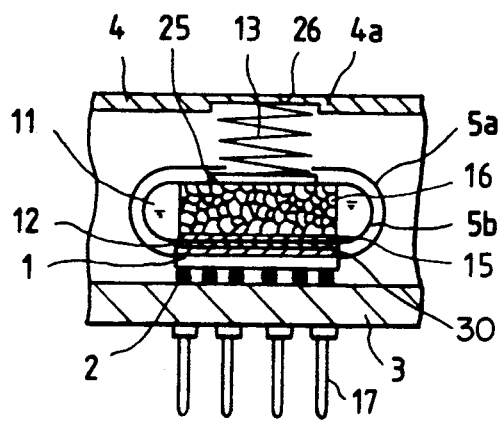
FIG. 19 is a longitudinally sectional view showing a seventh embodiment according to the present invention.

Further, in accordance with FIG. 19, a seventh embodiment of the present invention will be described. In the fifth embodiment, if the heat generation by the chips 1 is greater, it is necessary to enhance the thermal conduction to the coolant 11. Therefore, the structure of the cooling system of the forth embodiment of the multi-chip-module 50 is arranged to allow a foam metal block 16 having a large surface area to be joined to the straight tube section 5b of the coolant supply pipe 5 for each of the chips 1 by soldering, brazing, or the like 15. With this, the thermal conduction area is significantly increased to further enhance the cooling efficiency.

Therefore, with the present embodiment, it is possible to provide a multi-chip-module which is provided with a cooling system capable of maintaining its cooling efficiency even when the irregularity of the heights of the upper faces of the chips 1 is great.

Figure 20:
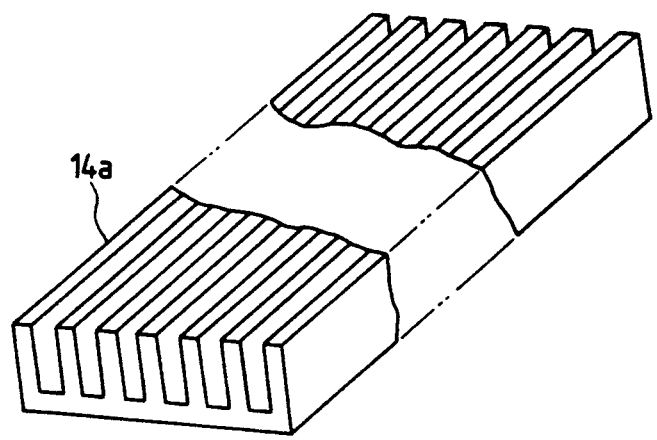
FIG. 20 is a perspective view showing the fins in connection with FIG. 21.
Figure 21:
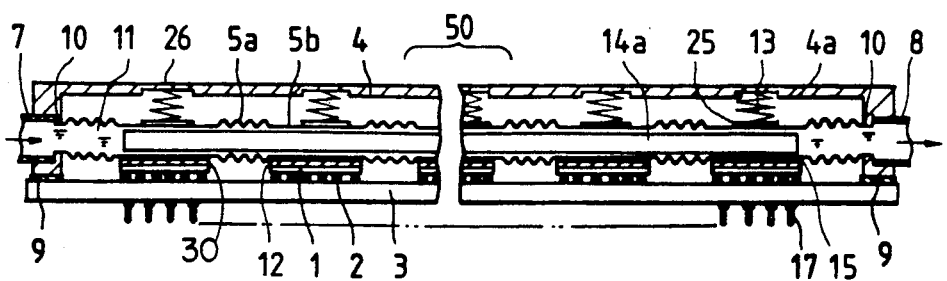
FIG. 21 is a cross-sectional view showing a eighth embodiment of the multi-chip-module according to the present invention.

Further, in accordance with FIG. 20 and FIG. 21, an eighth embodiment of the present invention will be described. In the sixth embodiment, if a large number of the chips 1 should be arranged, it is necessary to insert a large number of fins 14 into the straight tube sections 5b of the coolant supply pipe 5, and the number of the assembling steps becomes great. Therefore, the structure is arranged so as to employ one piece of fins 14a which is long in the axial direction as shown in FIG. 20, and insert such a long type fins in the axial direction of the coolant supply pipe 5 to join them together as shown in FIG. 21.

As a result, with the present embodiment, it is possible to perform the insertion and joining of the fins 14a to the straight tube sections 5b of the coolant supply pipe 5 simply when a large number of the chips 1 are arranged.

Figure 22:
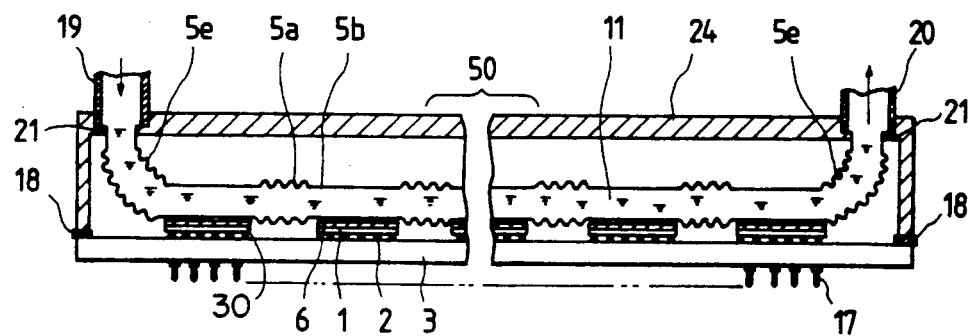
FIG. 22 is a cross-sectional view showing a ninth embodiment of the multi-chip-module according to the present invention.
Figure 23:
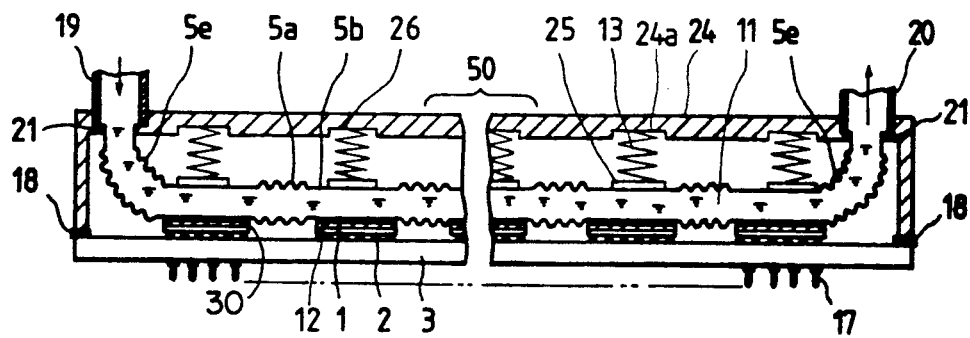
FIG. 23 is a cross-sectional view showing the ninth embodiment of the present invention when its structure is arranged for the pressure contact by springs.
Figure 24:
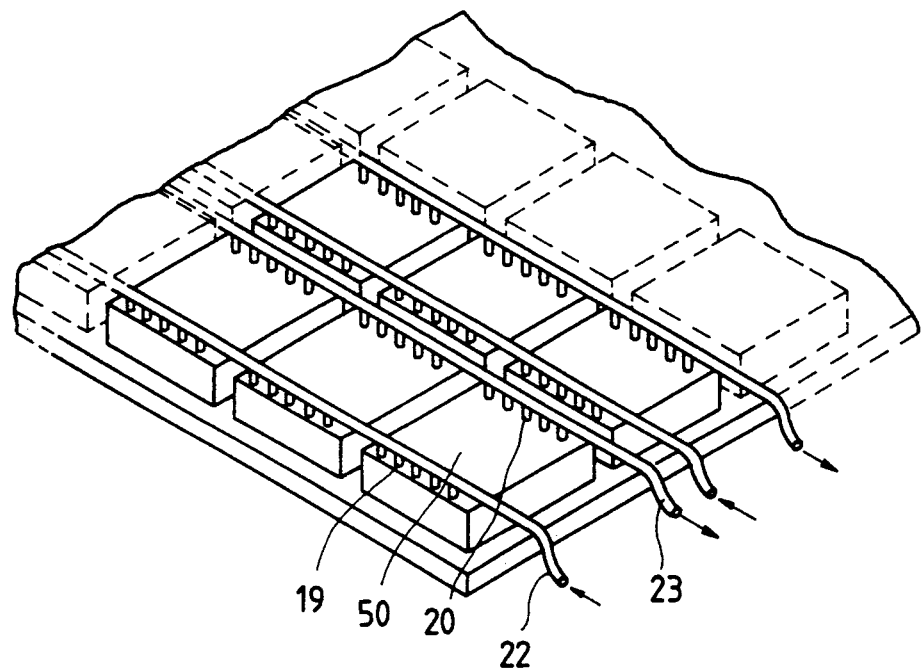
FIG. 24 is a perspective view showing the ninth embodiment of the present invention.
Figure 25:
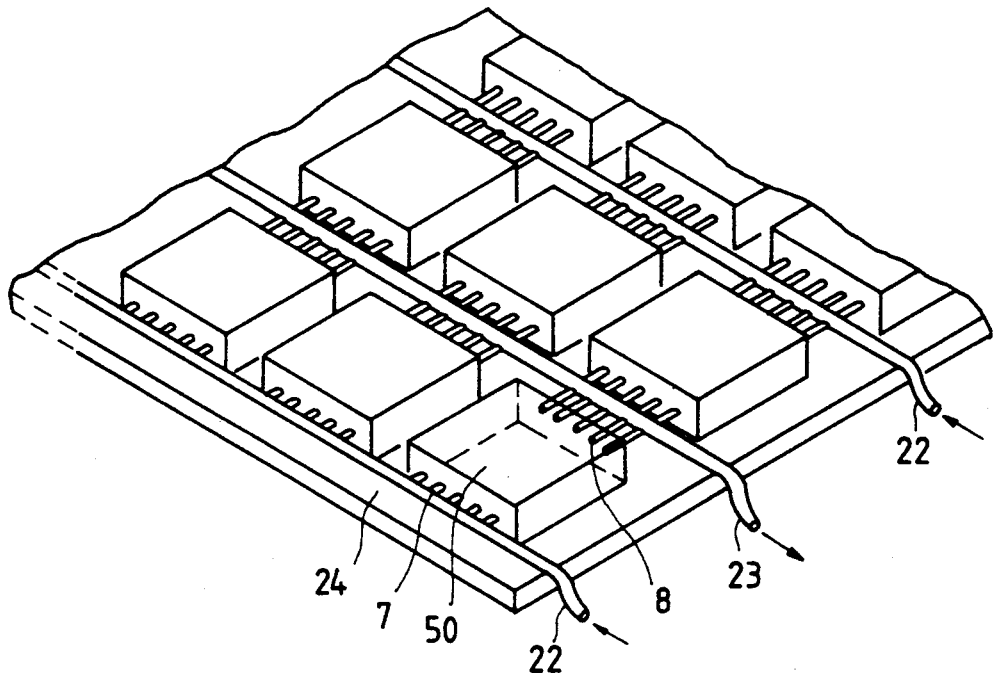
FIG. 25 is a perspective view showing the ninth embodiment of the present invention.
Figure 26:
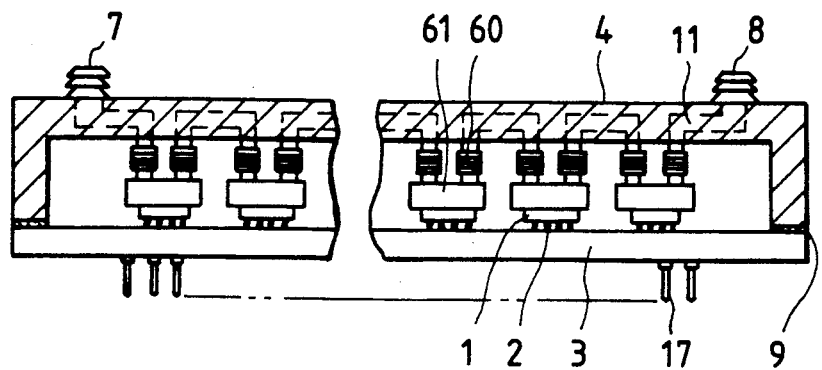
FIG. 26 is a cross-sectional view showing a conventional example.
Figure 27:
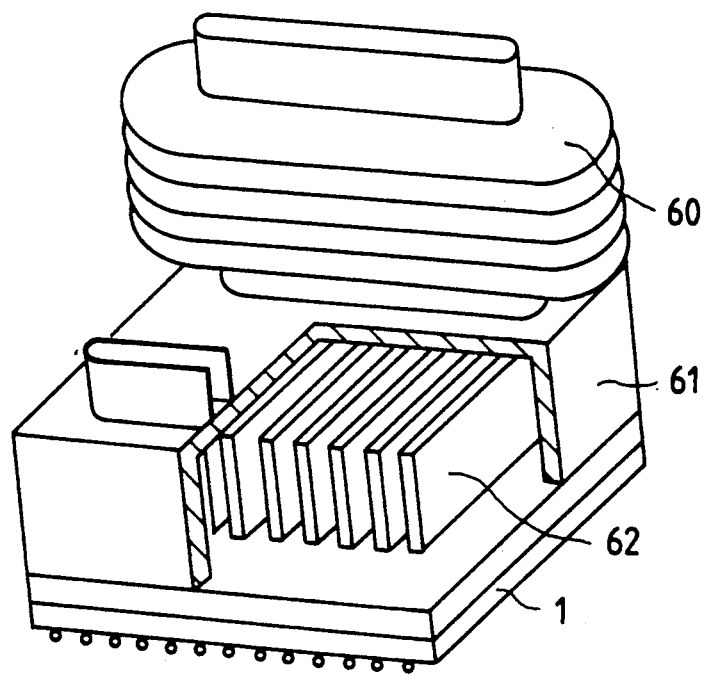
FIG. 27 is a perspective view showing a conventional example.

Further, in accordance with FIG. 22–FIG. 25, a ninth embodiment of the present invention will be described. In the first embodiment, if it is desired that a plurality of multi-chip-modules 50 be mounted more closely on the printed circuit board 24 with an improved spacing arrangement, the multi-chip-modules 50 cannot be installed at a high density because the pipe arrangements 7 and 8 guiding the flow of the coolant 11 are connected to the sides of the housing 4 and the main pipe arrangements 22 and 23 interfere with each other. Therefore, as shown in FIG. 22, the structure is arranged so as to bend the bellows sections 5e at both ends of the coolant supply pipe 5 almost perpendicular to the axial direction of the coolant supply pipe 5 to connect them to the upper face of the housing 24 for passing the coolant 11 via the pipe arrangements 19 and 20. Furthermore, the structure may employ the pressure contacts by springs as shown in FIG. 23 in the same way as the fifth embodiment.

With this, it is possible to make the printed circuit board 24 smaller because the pipe arrangements do not interfere with each other and the multi-chip-modules 50 can thus be installed with better spacing arrangements.

Hence, with this embodiment, its high density packaging can be implemented to miniaturize the computer as a whole.

As the above describes, according to the present invention, it is possible to provide a highly reliable multi-chip-module in a simple structure having a small number of junctions, which is capable of implementing the miniaturization of computers without lowering its cooling efficiency. In other words, the multi-chip-module of the present invention is structured with a cooling system, in which the coolant supply pipe having flexible bellows sections and straight tube sections alternately is arranged in parallel with upper faces of the chips; thus making it possible for the bellows sections to correct the inclinations of the chips and irregularity of its heights at the time of assembly or the thermal distortion of the chips during operation, and therefore minimize possible damages to the terminal connections.

Furthermore, because of a simpler structure and a smaller number of parts, it is possible to join the coolant supply pipe to the chips and seal the module as a whole at a time, subsequent to the connection of the coolant supply pipe to the inside of the housing. As a result, a collective assembling is possible to reduce the number of assembling steps significantly. Also, it is possible to provide a low, flat type multi-chip-module because the bellows sections are arranged in the horizontal direction.

Also, the straight tube sections of the coolant supply pipe are joined to the upper faces of the chips by soldering, brazing, or the like or are pressed by springs to be in contact therewith through thermal conductive grease, and by the thermal conductance at these portions, the heat generated by a plurality of chips can be removed continuously by the coolant flowing in one coolant supply pipe. Further, with the fins, foam metal block, or the like being provided in the straight tube sections of the coolant supply pipe, the thermal conduction area is significantly increased to make the enhancement of the cooling efficiency possible.

Also, the structure is arranged so as to bend the bellows sections at both ends of the coolant supply pipe almost perpendicular to the axial direction of the coolant supply pipe and connect them to the upper face of the housing to allow the coolant to flow in and out via the upper face of the housing. With this arrangement, it is possible to implement a high-density packaging because the pipe arrangements do not interfere with each other when a plurality of multi-chip-modules are closely installed on a printed circuit board and attain the miniaturization of a computer as a whole.

What is claimed is:

1. A multi-chip-module comprising:
   a plurality of chips in which each is provided with terminals;
   a cooling system provided with a coolant supply pipe including an arrangement of straight tube sections and flexible bellows sections alternately disposed in an axial direction thereof, said straight tube sections of said coolant supply pipe being joined metallically to upper faces of said plurality of chips;
   a multilayer circuit board electrically connected with said terminals of said plurality of chips; and
   I/O leads mounted on said multilayer circuit board and provided as external electrical terminal connections of said plurality of chips.

2. The multi-chip-module according to claim 1, wherein said module is provided with a cooling system which includes plate type fins in said straight tube sections of said coolant supply pipe.

3. The multi-chip-module according to claim 1, wherein said module is provided with a cooling system which includes foam metal blocks in said straight tube sections of said coolant supply pipe.

4. A multi-chip-module comprising:
   a plurality of chips in which each is provided with terminals;
   a cooling system provided with a coolant supply pipe including an arrangement of straight tube sections and bellows sections alternately disposed in an axial direction thereof, and including a plurality of springs disposed so that said straight tube sections of said coolant supply pipe become in contact with said plurality of chips under pressure exerted by said plurality of springs;
   a multilayer circuit board electrically connected with said terminals of said plurality of chips; and
   I/O leads mounted on said multilayer circuit board and provided as external electrical connections of said plurality of chips.

5. A multi-chip-module comprising:
   a plurality of chips in which each is provided with terminals;
   a cooling system provided with a coolant supply pipe including an arrangement of straight tube sections and bellows sections alternately disposed in an axial direction thereof, and including a plurality of springs disposed so that said straight tube sections of said coolant supply pipe become in contact with said plurality of chips under pressure exerted by said plurality of springs through thermal conductive grease present on each chip;
   a multilayer circuit board electrically connected with said terminals of said plurality of chips; and I/O leads mounted on said multilayer circuit board and provided as external electrical connections of said plurality of chips.

6. The multi-chip-module according to claim 5, wherein said module is provided with a cooling system which includes plate type fins in said straight tube sections of said coolant supply pipe.

7. The multi-chip-module according to claim 5, wherein said module is provided with a cooling system which includes foam metal blocks in said straight tube sections of said coolant supply pipe.

8. A multi-chip-module comprising:
a plurality of chips in which each is provided with terminals;
a cooling system provided with a coolant supply pipe including an arrangement of straight tube sections and bellows sections alternately disposed in an axial direction thereof, wherein said straight tube sections of said coolant supply pipe are joined metallically to said plurality of chips, and wherein said bellows sections at both ends of said coolant supply pipe are bent in a direction substantially perpendicular to said axial direction of said coolant supply pipe so as to fix straight tube sections respectively located at both ends of said coolant supply pipe to an upper face of said module;
a multilayer circuit board electrically connected with said terminals of said plurality of chips; and
I/O leads mounted on said multilayer circuit board and provided as external electrical connections of said plurality of chips.

* * * * *